(12) United States Patent
Bright

(10) Patent No.: US 6,583,744 B2
(45) Date of Patent: Jun. 24, 2003

(54) CORRECTION CIRCUIT FOR BETA MISMATCH BETWEEN THERMOMETER ENCODED AND R-2R LADDER SEGMENTS OF A CURRENT STEERING DAC

(75) Inventor: William J. Bright, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 09/887,476

(22) Filed: Jun. 22, 2001

(65) Prior Publication Data

US 2003/0001765 A1 Jan. 2, 2003

(51) Int. Cl.$^7$ ................................................ H03M 1/68
(52) U.S. Cl. ........................ 341/145; 341/118; 341/135
(58) Field of Search ................................. 341/133, 135, 341/136, 144, 145, 153, 154, 118

(56) References Cited

U.S. PATENT DOCUMENTS

| | | | | |
|---|---|---|---|---|
| 4,492,954 A | * | 1/1985 | Harris | 341/133 |
| 4,644,325 A | * | 2/1987 | Miller | 341/135 |
| 5,153,592 A | * | 10/1992 | Fairchild et al. | 341/118 |
| 5,790,060 A | * | 8/1998 | Tesch | 341/145 |
| 6,448,917 B1 | * | 9/2002 | Leung et al. | 341/154 |

* cited by examiner

Primary Examiner—Howard L. Williams
(74) Attorney, Agent, or Firm—W. Daniel Swayze, Jr.; W. James Brady; Frederick J. Telecky, Jr.

(57) ABSTRACT

A current correction circuit 500 eliminates beta mismatches between a thermometer encoded segment 102 and a R-2R ladder segment 106 of a current steering digital-to-analog converter 100. The circuit 500 consists of three replica MSB unit current sources, $I_1$, $I_2$ and $I_3$. The replica current $I_1$ acts as a replica to a cascode device 206 of the MSB unit 200 of the current steering DAC 100. The replica current $I_2$ replicates an effective base current equal to the total base current in the R-2R ladder circuit portion 300 of the current steering DAC 100. The replica current $I_3$ replicates the total base current of the L output switches 310 in the LSB segment 106 of the current steering DAC 100. A high impedance summing node 506 produces a correction current $I_{COR}=I_1-(I_2+I_3)$. This current is equal to the current difference between an MSB unit 200 and the LSB segment 106. This correction current is then subtracted from the MSB unit current source 200 that supplies current into the R-2R ladder 300 such that the current supplied to the R-2R ladder 300 will be equal to the MSB replica current source minus the correction current.

21 Claims, 4 Drawing Sheets

CORRECTION CIRCUIT FOR BETA MISMATCH BETWEEN THERMOMETER ENCODED AND R-2R LADDER SEGMENTS OF A CURRENT STEERING DAC

BACKGROUND OF THE INVENTION

1. Field of the Invention

This invention relates generally to data converters, and more particularly to a system and method for correcting the beta mismatch between thermometer encoded and R-2R ladder segments of a current steering digital-to-analog converter (DAC).

2. Description of the Prior Art

The technique of segmentation has been used, among other reasons, to reduce both the area and power consumption of digital-to-analog converters (DACs). Each segment generally uses either a binary-to-thermometer encoder or a binary-to-binary encoder. For an N-bit current steering DAC, there is a desire to combine an M-bit thermometer encoded segment with an L-bit binary encoded segment. In this notation, the M-bit segment represents the most significant bits (MSBs), and the L-bit segment represents the least significant bits of the N-bit DAC, where N=M+L. FIG. 1 illustrates a block diagram of an N-bit current steering DAC 100.

The M-bit thermometer encoded segment 102 of the DAC 100 as shown in FIG. 1 consists of $2^M-1$ equal current sources 104. These current sources 104 are individually switched to either the true or complement output as determined by the thermometer encoding of the M most significant bits. Also shown in FIG. 1 is a binary encoded L-bit segment 106 of the DAC 100 as an R-2R ladder. The R-2R ladder outputs a binary weighted current to the true or complement output as determined by the L least significant bits of the N-bit input.

The foregoing DAC 100 has a boundary condition between the MSB and the LSB segments that must be satisfied for the DAC 100 output to remain linear. This boundary condition necessitates that the total output current of the R-2R ladder must be one least significant bit less than the output current of a single current source in the MSB segment. This condition is met to first order by using a replica MSB current source 108 to supply the total current to the R-2R ladder where it is noted that the R-2R circuit already functions to subtract the equivalent of an LSB current from the total current supplied. The replica MSB current source 108 is labeled $I_{REP}$ in FIG. 1.

According to one embodiment, the foregoing boundary condition requiring the DAC 100 to remain linear across the two segments 102, 106 is only met to first order because the NPN devices used throughout have a current gain, $\beta_F$, that is dependent on the collector current density. This will cause the total base current of the R-2R ladder to not equal that of the cascode of an MSB unit current source and result in a nonlinearity. This concept can be better understood by taking a closer look at the M-bit thermometer encoded segment 102 MSB current source 104 and the binary encoded L-bit segment 106 R-2R ladder designs.

One embodiment of a current source 200 that can be used in the MSB segment 102 is shown in FIG. 2. The current source 200 consists of a bipolar junction transistor (BJT) 202 designated as $Q_1$, a degeneration resistor 204, designated as $R_E$, a cascode device 206, designated as $Q_c$, and a differential output switch 208, consisting of transistors 210 and 212, designated as QSW_MSB and QSW—MSB respectively.

One embodiment of the LSB segment circuit 106 which includes the R-2R ladder 300 is shown in FIG. 3. The LSB segment circuit 106 consists of a BJT 302, designated as $Q_{1r}$, and degeneration resistor 304, designated as $R_{Er}$, where the subscript r denotes the devices to be replicas to those in the MSB current source 200 described herein before with reference to FIG. 2. The R-2R ladder 300 consists of L binary weighted currents that are established with a binary weighted number of BJT devices 306 ($Q_{bi}$). Here, the notation b represents the significance of the current from 1 to L, and i represents the NPN device within that current from 1 to $2^{b-1}$. For example, the LSB device 308 has a b=1 and NPN devices indexed from 1 to $2^0=1$. The most significant current weight in the R-2R ladder 300 has a b=L and NPN devices indexed from i=1 to i=$2^{L-1}$. Also shown in FIG. 3 is an output switch for each binary weighted current. These output switches 310 are identical to those of the MSB segment 200 described in FIG. 2.

It can be seen from FIG. 3 that the R-2R ladder 300 in the LSB segment 106 is substituted for a single cascode device of an MSB unit current source. Further, the LSB segment 106 has L output switches 310 (differential pairs) and one dump device 320 ($Q_d$), compared with the MSB unit current source that has just one output switch. The boundary condition, discussed herein before, requires the total output current of the LSB segment 106 to be one LSB less than that supplied to the output by an MSB unit. This boundary condition requires that the total base current of the R-2R ladder 300 NPN devices 306, $\Sigma I_B(Q_{bi})$, L output switches 310, $I_B(Q_{SW\_LSB})$, and dump device 320, $I_B(Q_d)$, should be equal to the total base current of the MSB unit cascode 206, $I_B(Q_c)$, and the output switch 208, $I_B(Q_{SW\_})$. This boundary condition is described by equation (1) below as:

$$\sum_{b=1}^{L}\left(\sum_{i=1}^{2^{b-1}} I_B(Q_{bi}) + I_B(Q_{SW\_LSB})\right) + I_B(Q_d) = I_B(Q_c) + I_B(Q_{SW\_MSB}) \quad (1)$$

The boundary condition of equation (1) however is not satisfied since the NPN current gain, $\beta_F$, has a dependence on collector current density. A typical plot of current gain as a function of collector current is illustrated in FIG. 4. The collector current density of an MSB unit current source which uses a minimum feature size cascode device 206 is in the range of 400 $\mu A/\mu m^2$. This same current density will be present in the MSB 20 unit output switch 208 as well.

With continued reference to FIG. 4, it can be seen that the current gain, $\beta_F$, at a 400 $\mu A/\mu m^2$ current density is approximately 87 A/A. The collector current density for an L=4 bit R-2R ladder is approximately 27 $\mu A/m^2$ or a factor of 16 less. FIG. 4 shows that this lower current density corresponds to a current gain of 92 A/A or an increase of 6%. This 6% difference in current gain, $\beta_F$, will cause the total base current in the R-2R ladder to be 6% less than the cascode device 206 of an MSB unit since $I_C=\beta_F I_B$. A 6% error at the boundary of an L=4 bit segment will translate into a differential nonlinearity with a magnitude approximately equal to one LSB (i.e. $2^{4}*0.06=0.96$) and repeats every 16 codes.

Adding to the differences between the R-2R ladder and the cascode device 206 are the different current densities associated with the output switches 208, 310. Since the MSB unit current source 200 uses an output switch NPN of size equal to the cascode device 206, the current density will be the same 400 $\mu A/\mu m^2$. The effective current density of the output switches 310 in the LSB segment 106 however, will be $(400 \mu A/\mu m^2)/L$. For an LSB segment of L=4, the current density will be $100 \mu A/\mu m^2$ and the current gain will be 90. This is a smaller error of 3%; however, this will correspond to a differential nonlinearity having a magnitude of 0.5 LSB.

The above described effective base current mismatches between an MSB unit and the LSB segment 106 are additive and will result in a differential nonlinearity of approximately 1.5 LSBs that repeat every $2^L$ codes in the DAC 100 transfer function. This error is present even with a perfect R-2R ladder and no mismatch between a MSB unit and replica current source. Further, the magnitude of this error increases with L.

In view of the foregoing, there is a need for a system and method for eliminating the differential nonlinearities caused by beta mismatches between thermometer encoded and R-2R ladder segments of a current steering digital-to-analog converter (DAC).

SUMMARY OF THE INVENTION

The present invention provides a system and method for eliminating the differential nonlinearity caused by beta mismatches between thermometer encoded (MSB) and R-2R ladder (LSB) segments of a current steering digital-to-analog converter (DAC).

In one aspect of the invention, a system is provided that creates a correction current equal to the difference in base current between a thermometer encoded and a binary encoded segment of a DAC.

In another aspect of the invention, a system is provided that creates a correction current for any combination of M-bits with a most significant bit segment and an L-bit least significant bit segment of a DAC, where N=M+L is the total number of bits in the DAC.

In still another aspect of the invention, a system is provided for subtracting a correction current from the current supplied to the LSB segment R-2R ladder circuit of a DAC.

According to one embodiment of the present invention, a circuit consists of three replica MSB unit current sources, $I_1$, $I_2$ and $I_3$. The replica current I1 acts as a replica to a cascode device of the MSB unit of a current steering DAC. The replica current $I_2$ replicates an effective base current equal to the total base current in the R-2R ladder circuit portion of the current steering DAC. The replica current $I_3$ replicates the total base current of the L output switches in the LSB segment of the current steering DAC. A high impedance summing node produces a correction current $I_{COR}=I_1-(I_2+I_3)$. This current is equal to the current difference between an MSB unit and the LSB segment. This correction current is then subtracted from the MSB unit current source that supplies current into the R-2R ladder such that the current supplied to the R-2R ladder will be equal to the MSB replica current source minus the correction current.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 4:
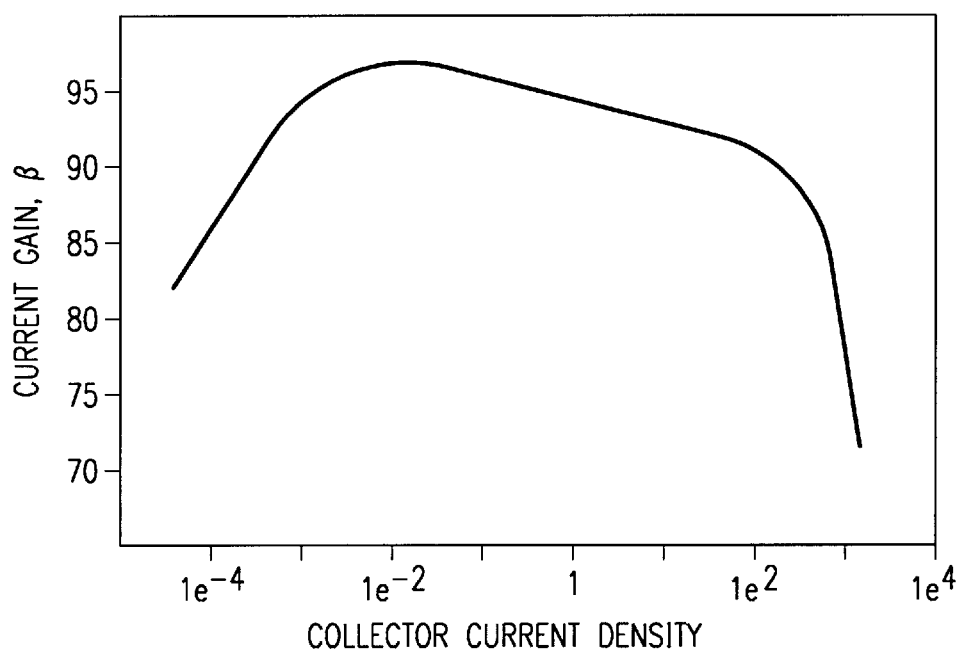
FIG. 4 illustrates a typical plot of current gain as a function of collector current for a bipolar junction transistor.
Figure 5:
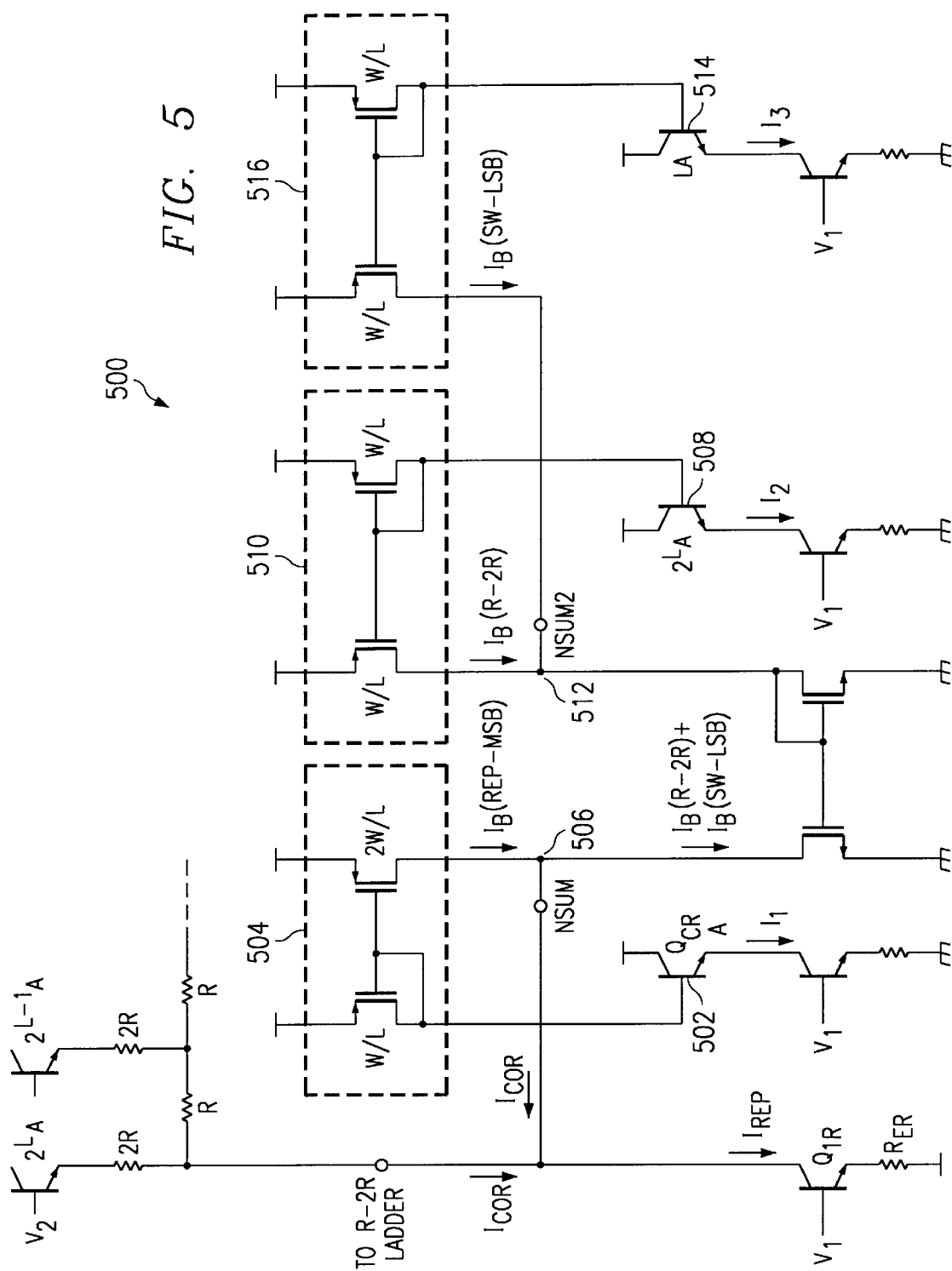
FIG. 5 is a schematic diagram illustrating a differential nonlinearity elimination circuit for the current steering DAC depicted in FIGS. 1–3 according to one embodiment of the present invention.

The present invention can best be understood by first repeating the background set forth herein before with reference to FIGS. 1–4 before setting forth the detailed description of the present embodiment of the invention with the aid of FIG. 5.

Figure 1:
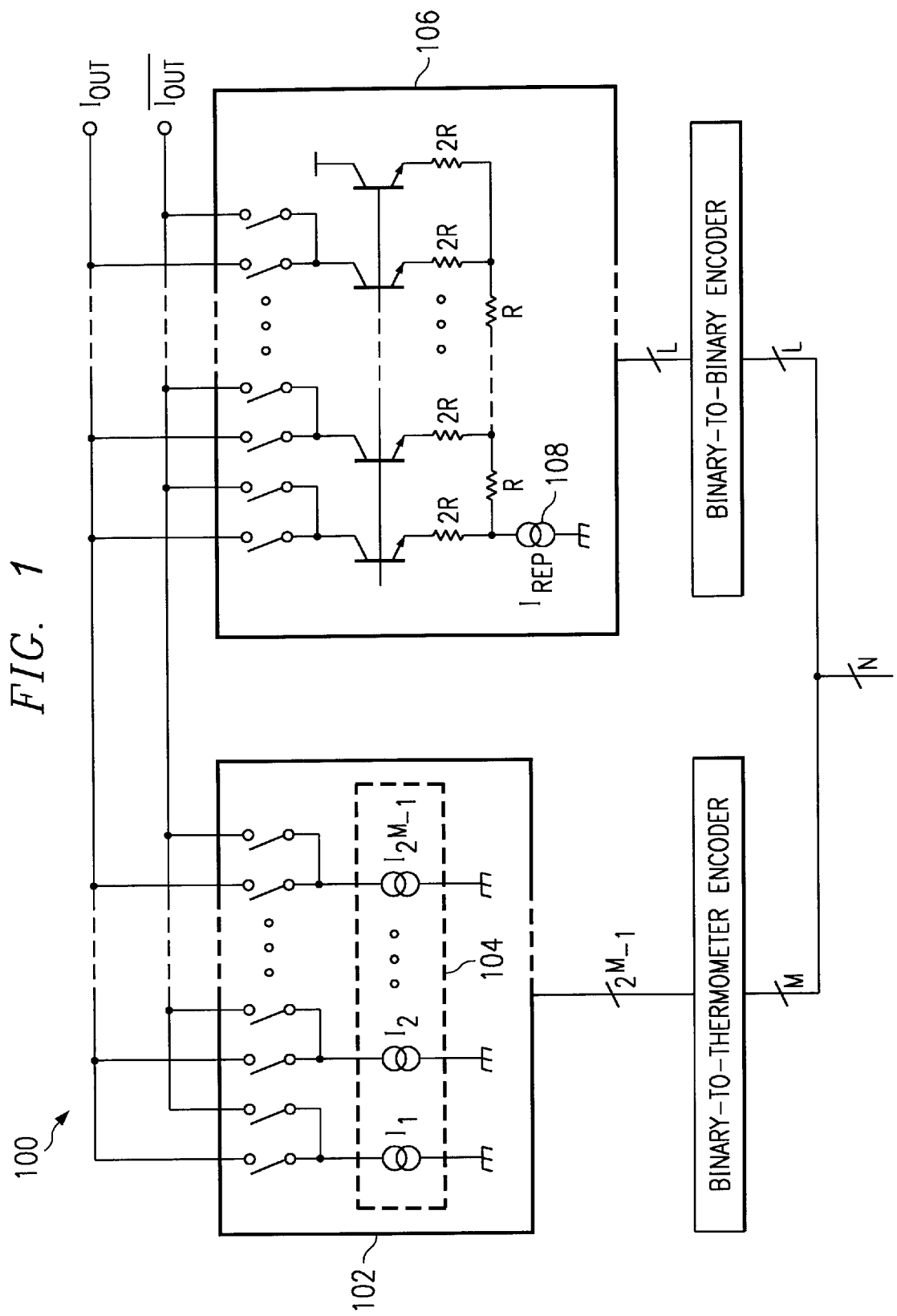
FIG. 1 illustrates a current steering DAC having a thermometer encoded (MSB) segment and a R-2R ladder (LSB) segment.

The technique of segmentation has been used, among other reasons, to reduce both the area and power consumption of digital-to-analog converters (DACs). Each segment generally uses either a binary-to-thermometer encoder or a binary-to-binary encoder. For an N-bit current steering DAC, there is a desire to combine an M-bit thermometer encoded segment with an L-bit binary encoded segment. In this notation, the M-bit segments represent the most significant bits (MSBs), and the L-bit segment represents the least significant bits of the N-bit DAC, where N=M+L. FIG. 1 illustrates a block diagram of an N-bit current steering DAC 100.

The M-bit thermometer encoded segment 102 of the DAC 100 as shown in FIG. 1 consists of $2^M-1$ equal current sources 104. These current sources 104 are individually switched to either the true or complement output as determined by the thermometer encoding of the M most significant bits. Also shown in FIG. 1 is a binary encoded L-bit segment 106 of the DAC 100 as an R-2R ladder. The R-2R ladder outputs a binary weighted current to the true or complement output as determined by the L least significant bits of the N-bit input.

The foregoing DAC 100 has a boundary condition between the MSB and the LSB segments that must be satisfied for the DAC 100 output to remain linear. This boundary condition necessitates that the total output current of the R-2R ladder must be one least significant bit less than the output current of a single current source in the MSB segment. This condition is met to first order by using a replica MSB current source 108 to supply the total current to the R-2R ladder where it is noted that the R-2R circuit already functions to subtract the equivalent of an LSB current from the total current supplied. The replica MSB current source 108 is labeled $I_{REP}$ in FIG. 1.

According to one embodiment, the foregoing boundary condition requiring the DAC 100 to remain linear across the two segments 102, 106 is only met to first order because the NPN devices used throughout have a current gain, $\beta_F$, that is dependent on the collector current density. This will cause the total base current of the R-2R ladder to not equal that of the cascode of an MSB unit current source and result in a nonlinearity. This concept can be better understood by taking a closer look at the M-bit thermometer encoded segment 102 MSB current source 104 and the binary encoded L-bit segment 106 R-2R ladder designs.

Figure 2:
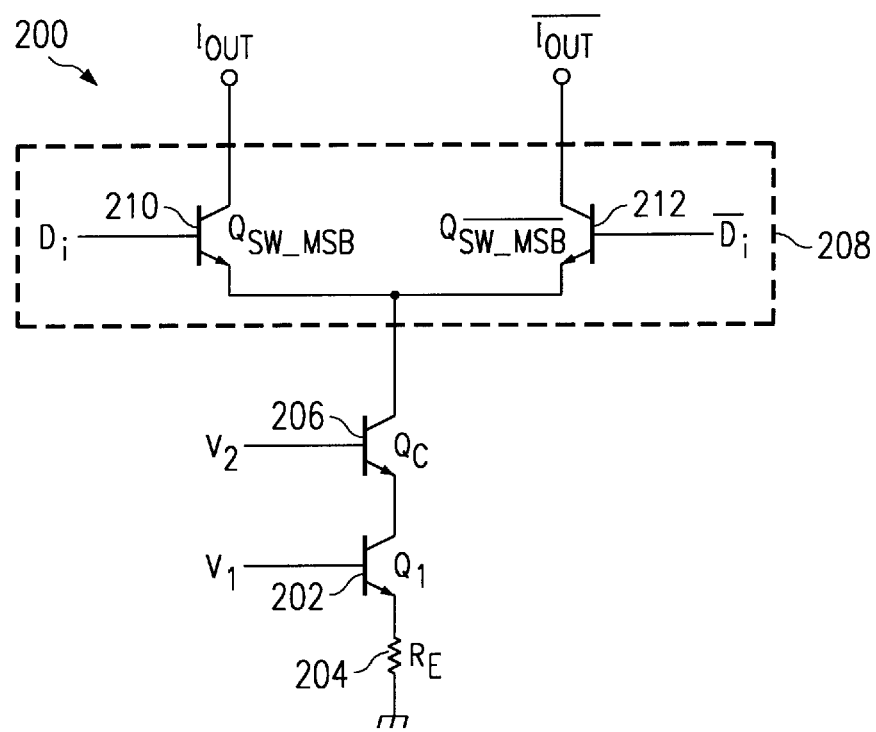
FIG. 2 is a schematic diagram illustrating more details of a current source suitable for use with the DAC shown in FIG. 1.

One embodiment of a current source 200 that can be used in the MSB segment 102 is shown in FIG. 2. The current source 200 consists of a bipolar junction transistor (BJT) 202 designated as $Q_1$, a degeneration resistor 204, designated as $R_E$, a cascode device 206, designated as $Q_c$, and a differential output switch 208, consisting of transistors 210 and 212, designated as QSW_MSB and $\overline{\text{QSW\_MSB}}$ respectively.

Figure 3:
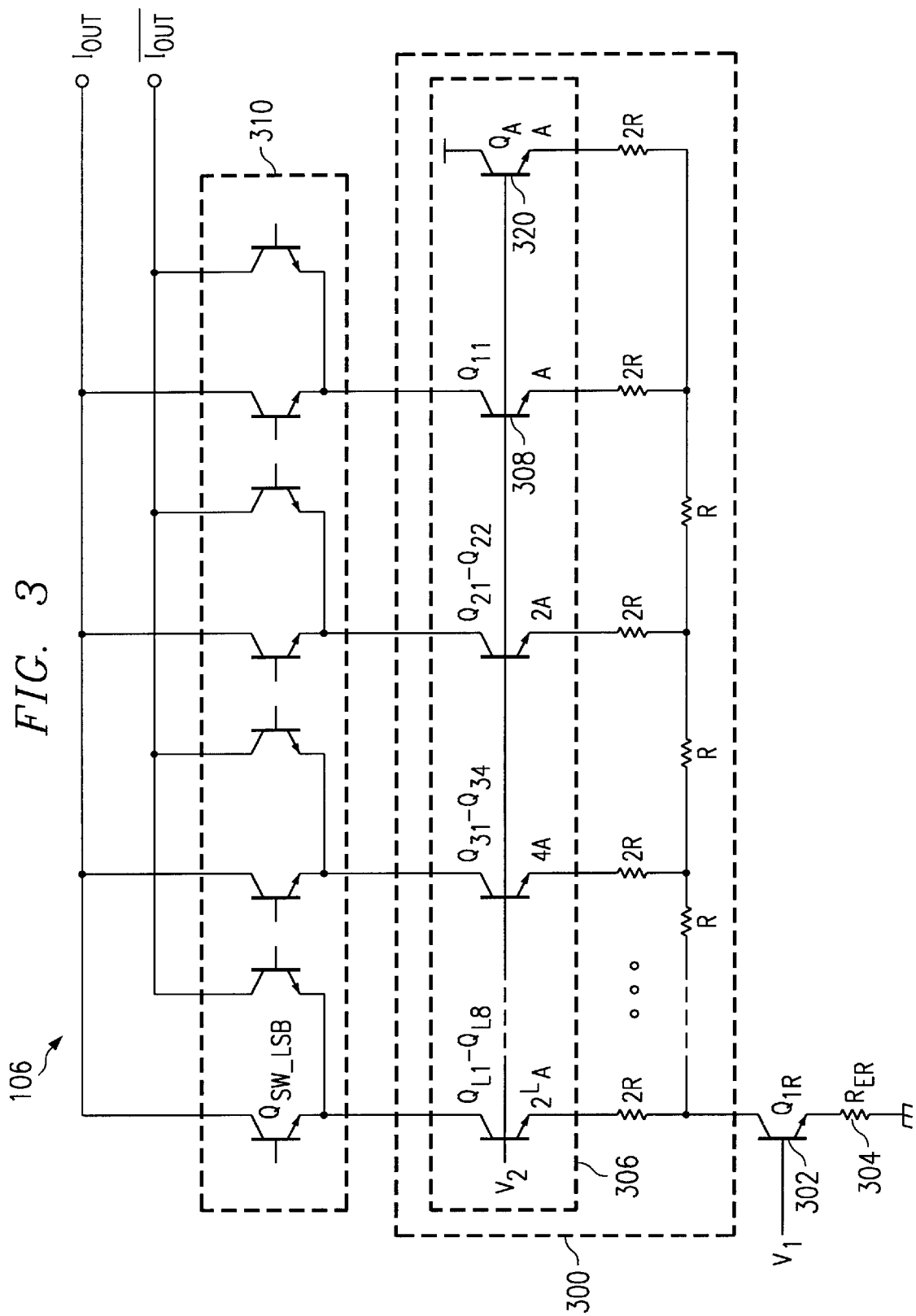
FIG. 3 is a schematic diagram illustrating more details of the R-2R ladder segment shown in FIG. 1.

One embodiment of the LSB segment circuit 106 which includes the R-2R ladder 300 is shown in FIG. 3. The LSB segment circuit 106 consists of a BJT 302, designated as $Q_{1r}$, and degeneration resistor 304, designated as $R_{Er}$, where the subscript r denotes the devices to be replicas to those in the MSB current source 200 described herein before with reference to FIG. 2. The R-2R ladder 300 consists of L binary weighted currents that are established with a binary weighted number of BJT devices 306 ($Q_{bi}$). Here, the notation b represents the significance of the current from 1 to L, and i represents the NPN device within that current from 1 to $2^{b-1}$. For example, the LSB device 308 has a b=1 and NPN devices indexed from 1 to $2^0=1$. The most significant current weight in the R-2R ladder 300 has a b=L and NPN devices indexed from i=1 to $i=2^{L-1}$. Also shown in FIG. 3 is an output switch for each binary weighted current. These output switches 310 are identical to those of the MSB segment 200 described in FIG. 2.

It can be seen from FIG. 3 that the R-2R ladder 300 in the LSB segment 106 is substituted for a single cascode device of an MSB unit current source. Further, the LSB segment 106 has L output switches 310 (differential pairs) and one dump device 320 ($Q_d$), compared with the MSB unit current source that has just one output switch. The boundary condition, discussed herein before, requires the total output current of the LSB segment 106 to be one LSB less than that supplied to the output by an MSB unit. This boundary condition requires that the total base current of the R-2R ladder 300 NPN devices 306, $\Sigma I_B(Q_{bi})$, L output switches 310, $I_B(\text{QSW\_LSB})$, and dump device 320, $I_B(Q_d)$, should be equal to the total base current of the MSB unit cascode 206, $I_B(Q_c)$, and the output switch 208, $I_B(\text{QSW\_MSB})$. This boundary condition is described by equation (1) below as:

$$\sum_{b=1}^{L}\left(\sum_{i=1}^{2^{b-1}} I_B(Q_{bi}) + I_B(Q_{\text{SW\_LSB}})\right) + I_B(Q_d) = I_B(Q_c) + I_B(Q_{\text{SW\_MSB}}) \quad (1)$$

The boundary condition of equation (1) however is not satisfied since the NPN current gain, $\beta_F$, has a dependence on collector current density. A typical plot of current gain as a function of collector current is illustrated in FIG. 4. The collector current density of an MSB unit current source which uses a minimum feature size cascode device 206 is in the range of 400 $\mu A/\mu m^2$. This same current density will be present in the MSB unit output switch 208 as well.

With continued reference to FIG. 4, it can be seen that the current gain, $\beta_F$, at a 400 $\mu A/\mu m^2$ current density is approximately 87 A/A. The collector current density for an L=4 bit R-2R ladder is approximately 27 $\mu A/\mu m^2$ or a factor of 16 less. FIG. 4 shows that this lower current density corresponds to a current gain of 92 A/A or an increase of 6%. This 6% difference in current gain, OF, will cause the total base current in the R-2R ladder to be 6% less than the cascode device 206 of an MSB unit since $I_C=\beta_F I_B$. A 6% error at the boundary of an L=4 bit segment will translate into a differential nonlinearity with a magnitude approximately equal to one LSB (i.e. $2^4 \ast 0.06 = 0.96$) and repeats every 16 codes.

Adding to the differences between the R-2R ladder and the cascode device 206 are the different current densities associated with the output switches 208, 310. Since the MSB unit current source 200 uses an output switch NPN of size equal to the cascode device 206, the current density will be the same 400 $\mu A/\mu m^2$. The effective current density of the output switches 310 in the LSB segment 106 however, will be $(400 \mu A/\mu m^2)/L$. For an LSB segment of L=4, the current density will be 100 $\mu A/\mu m^2$ and the current gain will be 90. This is a smaller error of 3%; however, this will correspond to a differential nonlinearity having a magnitude of 0.5 LSB.

The above described effective base current mismatches between an MSB unit and the LSB segment 106 are additive and will result in a differential nonlinearity of approximately 1.5 LSBs that repeat every $2^L$ codes in the DAC 100 transfer function. This error is present even with a perfect R-2R ladder and no mismatch between a MSB unit and replica current source. Further, the magnitude of this error increases with L.

FIG. 5 is a schematic diagram illustrating a differential nonlinearity elimination circuit 500 for the current steering DAC depicted in FIGS. 1–3 according to one embodiment of the present invention. The circuit 500 includes three replica MSB unit current sources, $I_1$, $I_2$ and $I_3$.

The replica current $I_1$ is connected to a single NPN device 502 that acts as a replica to the cascode device 206 of the MSB unit discussed herein before. This device creates a base current equal to the MSB unit cascode device 206 and is connected to an MOS current mirror 504. This current mirror 504 multiplies the base current by 2× to account for the base current of the MSB unit output switch 208 which has a base current equal to that of the cascode device 206. This mirrored current, $I_B(\text{rep\_msb})$ is connected to a current summing node 506.

The replica current 12 is connected to $2^L$ NPN devices 508 which represent the total number of NPN devices in the R-2R ladder 300. These $2^L$ NPN devices 508 create an effective base current, $I_B(\text{R-2R})$, equal to the total base current in the R-2R ladder circuit 300. This replica base current, $I_B(\text{R-2R})$, is connected to a second MOS current mirror 510 and summing node 512.

The third replica current 13 is connected to L NPN devices 514 which replicate the L output switches 310 in the LSB segment 106. These L NPN devices 310 create an effective base current, $I_B(\text{sw\_lsb})$, equal to the total base current of the L output switches 310 in the LSB segment 106. This base current is connected to a third MOS current mirror 516 and also to summing node 512.

The two replica currents $I_B(\text{R-2R})$ and $I_B(\text{sw\_lsb})$ are added together at the summing node 512 to create a current, $I_B(\text{rep\_lsb})$, which is equal to the total base current of the LSB segment 106 of the DAC 100. This LSB replica base current is connected to the NMOS current mirror 504 and summing junction 506. Since the current $I_B(\text{rep\_lsb})$ is a sink at the summing junction 506 however, it will have a minus sign relative to $I_B(\text{rep\_msb})$.

The high impedance summing junction 506 will have a net correction current of $I_{COR}=I_B(\text{rep\_msb})-I_B(\text{rep\_lsb})$.

This current is equal to the difference between an MSB unit and the LSB segment 106. This correction current, $I_{COR}$, is then subtracted from the MSB unit current source that supplies current into the R-2R ladder 300. The current supplied to the R-2R ladder 300 therefore will be equal to the MSB replica current, $I_{REP}$, minus the correction current, $I_{COR}$.

In summary explanation, a circuit consists of three replica MSB unit current sources, $I_1$, $I_2$ and $I_3$. The replica current $I_1$ acts as a replica to a cascode device of the MSB unit of a current steering DAC. The replica current $I_2$ replicates an effective base current equal to the total base current in the R-2R ladder circuit portion of the current steering DAC. The replica current $I_3$ replicates the total base current of the L output switches in the LSB segment of the current steering DAC. A high impedance summing node produces a correction current $I_{COR}=I_1-(I_2+I_3)$. This current is equal to the difference between an MSB unit and the LSB segment. This correction current is then subtracted from the MSB unit current source that supplies current into the R-2R ladder such that the current supplied to the R-2R ladder will be equal to the MSB replica current source minus the correction current.

In view of the above, it can be seen the present invention presents a significant advancement in the art of current steering DAC technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A current correction circuit comprising:
   a first current generating circuit operational to produce a first replica current equal to a most significant bit (MSB) unit cascode device base current associated with a MSB segment of a digital-to-analog converter (DAC);
   a second current generating circuit operational to produce a second replica current equal to a total device base current of an R-2R ladder circuit portion of a least significant bit (LSB) segment of a DAC;
   a third current generating circuit operational to produce a third replica current equal to a total device base current of an output switch portion of the LSB segment of a DAC;
   a first high impedance summing circuit operational to sum the second and third replica currents and generate a negative current equal to a total combined device base current associated with the LSB segment of the DAC; and
   a second high impedance summing circuit operational to sum the first replica current with the negative current to generate a correction current therefrom such that the correction current is equal to a current difference between an MSB unit and the LSB segment.

2. The current correction circuit according to claim 1 wherein the MSB unit is associated with a thermometer encoded segment of a DAC.

3. The current correction circuit according to claim 1 wherein the LSB segment comprises a binary encoded segment of a DAC.

4. The current correction circuit according to claim 1 wherein the MSB unit cascode device base current is associated with at least one bipolar junction transistor.

5. The current correction circuit according to claim 1 wherein the total device base current of an R-2R ladder circuit portion of a LSB segment of a DAC is associated with a plurality of bipolar junction transistors.

6. The current correction circuit according to claim 1 wherein the total base current of an output switch portion of the LSB segment of a DAC is associated with a plurality of bipolar junction transistors.

7. The current correction circuit according to claim 1 further comprising a fourth current generating circuit operational to produce a replicated MSB unit source current such that a current supplied into the R-2R ladder circuit portion of the LSB segment is equal to the MSB replica source current minus the correction current.

8. The current correction circuit according to claim 1 wherein the first high impedance summing circuit comprises:
   a first current mirror operational to mirror the second replica current;
   a second current mirror operational to mirror the third replica current;
   a high impedance summing node configured to sum the mirrored second and third replica currents; and
   a third current mirror operational to mirror a negative sum of the mirrored second and third replica currents.

9. The current correction circuit according to claim 8 wherein the second high impedance summing circuit comprises:
   a current mirror operational to mirror the first replica current; and
   a high impedance summing node configured to sum the mirrored first replica current with the negative sum of the mirrored second and third replica currents to generate the correction current.

10. A current correction circuit comprising:
    a first current generating means for generating a first replica current equal to a most significant bit (MSB) unit cascode transistor base current associated with a thermometer encoded segment of a current steering digital-to-analog converter (DAC);
    a second current generating means for generating a second replica current equal to a total transistor base current of an R-2R ladder circuit portion of a binary encoded segment of a current steering DAC;
    a third current generating means for generating a third replica current equal to a total transistor base current of an output switch portion of the binary encoded segment of a current steering DAC;
    a first summing means for summing the second and third replica currents and generating a negative current therefrom; and
    a second summing means for summing the first replica current with the negative current to generate a correction current therefrom such that the correction current is equal to a difference between a DAC MSB unit current and a DAC LSB segment total effective transistor base current.

11. The current correction circuit according to claim 10 wherein the first summing means comprises:

a first current mirroring means for mirroring the second replica current;

a second current mirroring means for mirroring the third replica current;

a high impedance summing node configured to sum the mirrored second and third replica currents; and a third current mirroring means for mirroring a negative sum of the mirrored second and third replica currents.

12. The current correction circuit according to claim 11 wherein the second summing means comprises:

a current mirroring means for mirroring the first replica current; and a high impedance summing node configured to sum the mirrored first replica current with the negative sum of the mirrored second and third replica currents to generate the correction current therefrom.

13. The current correction circuit according to claim 12 further comprising a fourth current generating means for generating a replicated MSB unit source current such that a current supplied into the R-2R ladder circuit portion of the binary encoded segment is equal to the MSB replica source current minus the correction current.

14. A method of generating a digital-to-analog converter (DAC) correction current comprising the steps of:

replicating a most significant bit (MSB) segment current equal to a MSB unit cascode device base current;

replicating a first least significant bit (LSB) segment current equal to a total device base current of a R-2R ladder circuit portion of the LSB segment;

replicating a second LSB segment current equal to a total device base current of an output switch portion of the LSB segment;

summing the first LSB segment current and the second LSB segment current to generate a negative current equal to a total combined device base current associated with the LSB segment; and summing the MSB segment current and the negative current to generate a correction current therefrom such that the correction current is equal to a current difference between the MSB unit cascode device base current and the total combined device base current associated with the LSB segment.

15. The method according to claim 14 further comprising the steps of:

supplying a replicated MSB unit source current into the R-2R ladder circuit portion of the LSB segment; and subtracting the correction current from the replicated MSB unit source current such that base current mismatches between an MSB unit and the LSB segment of a DAC are substantially eliminated.

16. A DAC current correction circuit comprising:

a first current generating circuit operational to provide a replicated MSB unit source current into a R-2R ladder circuit portion of a LSB segment of a current steering DAC; and a second current generating circuit operational to provide a correction current such that base current mismatches between an MSB unit and the LSB segment are substantially eliminated when the correction current is subtracted from the replicated MSB unit source current.

17. The DAC current correction circuit according to claim 16 wherein the second current generating circuit comprises:

a first replica current generating circuit operational to produce a first replica current equal to a most significant bit (MSB) unit cascode device base current associated with a MSB segment of a digital-to-analog converter (DAC);

a second replica current generating circuit operational to produce a second replica current equal to a total device base current of an R-2R ladder circuit portion of a least significant bit (LSB) segment of a DAC;

a third replica current generating circuit operational to produce a third replica current equal to a total device base current of an output switch portion of the LSB segment of a DAC;

a first high impedance summing circuit operational to sum the second and third replica currents and generate a negative current equal to a total combined device base current associated with the LSB segment of the DAC; and a second high impedance summing circuit operational to sum the first replica current with the negative current to generate a correction current therefrom such that the correction current is equal to a current difference between an MSB unit and the LSB segment.

18. The DAC current correction circuit according to claim 16 wherein the MSB unit is associated with a thermometer encoded segment of a DAC.

19. The DAC current correction circuit according to claim 16 wherein the LSB segment comprises a binary encoded segment of a DAC.

20. The DAC current correction circuit according to claim 17 wherein the first high impedance summing circuit comprises:

a first current mirror operational to mirror the second replica current;

a second current mirror operational to mirror the third replica current;

a high impedance summing node configured to sum the mirrored second and third replica currents; and a third current mirror operational to mirror a negative sum of the mirrored second and third replica currents.

21. The DAC current correction circuit according to claim 20 wherein the second high impedance summing circuit comprises:

a current mirror operational to mirror the first replica current; and a high impedance summing node configured to sum the mirrored first replica current with the negative sum of the mirrored second and third replica currents to generate the correction current.

* * * * *